United States Patent [19]

Kim et al.

[11] Patent Number: 5,714,401
[45] Date of Patent: Feb. 3, 1998

[54] SEMICONDUCTOR DEVICE CAPACITOR MANUFACTURED BY FORMING STACK WITH MULTIPLE MATERIAL LAYERS WITHOUT CONDUCTIVE LAYER THEREBETWEEN

[75] Inventors: Young-pil Kim, Suwon; Jong-bok Kim, Seongnam; Won-sik Lee, Seoul; Yong-hee Lee, Seongnam, all of Rep. of Korea

[73] Assignee: Samsung Electronics Co., Ltd., Suwon, Rep. of Korea

[21] Appl. No.: 521,985

[22] Filed: Aug. 31, 1995

[30] Foreign Application Priority Data

Aug. 31, 1994 [KR] Rep. of Korea ............. 94-21905

[51] Int. Cl.⁶ ............................................. H01L 21/8242
[52] U.S. Cl. ........................... 437/52; 437/60; 437/919
[58] Field of Search .......................... 437/919, 52, 60; 257/306–308

[56] References Cited

U.S. PATENT DOCUMENTS 5,447,878  9/1995  Park et al. .................... 437/919

*Primary Examiner*—Jey Tsai
*Attorney, Agent, or Firm*—Cushman Darby & Cushman IP Group of Pillsbury Madison & Sutro LLP

[57] ABSTRACT

A method is provided for manufacturing a capacitor of a semiconductor device. First, an insulating layer, an etching barrier layer, a first material layer and a second material layer are sequentially stacked on a semiconductor substrate on which a field oxide layer and a gate electrode are formed, and predetermined portions of the stacked layers are sequentially etched to form a contact hole exposing the substrate. Then, a first conductive layer is formed on thge whole surface of the resultant structure having the contact hole. Subsequently, a storage electrode pattern is formed by patterning the first conductive layer and etching the second material layer. Then, a second conductive layer is formed on the whole surface of the resultant structure so as to cover the storage electrode pattern and the first material layer. Thereafter, the second conductive layer is etched to expose the upper surface of the storage electrode pattern. Therefore, the capacitor manufacturing process, particularly, the etching process, is simplified, and can be applied to a capacitor having a COB structure.

12 Claims, 10 Drawing Sheets

SEMICONDUCTOR DEVICE CAPACITOR MANUFACTURED BY FORMING STACK WITH MULTIPLE MATERIAL LAYERS WITHOUT CONDUCTIVE LAYER THEREBETWEEN

BACKGROUND OF THE INVENTION

The present invention relates to a method for manufacturing a capacitor of a semiconductor device, and more particularly, to a method for manufacturing a static capacitor having a three-dimensional structure which may be used in a highly-integrated dynamic random access memory cell.

With increasing integration in DRAMs, a three-dimensional structure capacitor has been suggested to increase an amount of capacitance in the limited cell area. Examples structures include a cylinder structure, a trench structure, a fin structure and the like.

T. Ema et al. have suggested a static capacitor having a fin structure (see "3-Dimensional stacked capacitor cell for 16M and 64M DRAM" in IEDM, 1988). According to the suggested fin structure capacitor, a plurality of conductive layers and material layers are first alternately stacked on a semiconductor substrate. The material layers are then etched, so that the upper, side and lower area of the conductive layers can be used as an effective capacitor area.

Referring to FIGS. 1A to 1C, a method for manufacturing a capacitor having the above fin structure will be described.

In FIG. 1A, a field oxide layer 12 and gate electrodes 14 are formed on a semiconductor substrate 10. Then, a high-temperature oxide and a silicon nitride are sequentially deposited on the resultant on which gate electrodes 14 are formed, to thereby form an insulating layer 16 and an etching barrier layer 18. Thereafter, oxide material is deposited on etching barrier layer 18 so as to form a first material layer 20. Sequentially, a conductive layer 22, a second material layer 24, a second conductive layer 26 and a third material layer 28 are formed on first material layer 20 by depositing impurity-doped polycrystal silicon and oxide material one or more times, especially, two or more times.

Referring to FIG. 1B, predetermined portions of the above stacked layers are sequentially etched using a photolithography process, to thereby form a contact hole by which substrate 10 is exposed. The contact hold is buried by depositing impurity-doped polycrystal silicon on the whole surface of the resultant structure having the contact hole. A third conductive layer 30 with a predetermined thickness is then formed on third material layer 28.

Referring to FIG. 1C, third conductive layer 30, third material layer 28, second conductive layer 26, second material layer 24, first conductive layer 22 and first material layer 20 are sequentially etched using a photolithography process. Then, first, second and third material layers 20, 24 and 28 are all removed by a wet-etching process, to thereby form a storage electrode 32 having a fin structure.

According to the above manufacturing method, since the etching rates of the stacked conductive and material layers are different from each other, the layers should be alternately dry-etched for forming the contact hold. As a result, the etching equipment should be changed for each etching step. Also, there is a problem in that the first, second and third conductive layers are not connected each other in the contact hole if the fin structure is applied to a capacitor over bitline (COB) structure.

Different from the conventional structure in which the capacitor is formed prior to a bitline, a structure having a bitline which is formed prior to the capacitor will be described referring to FIG. 2. In FIG. 2, the reference numerals similar to those of FIGS. 1A to 1C represent similar materials.

Referring to FIG. 2, a field oxide layer 12 which separates the device from a gate electrode 14 is formed on a semiconductor substrate 10, and a source 11 and a drain 13 are formed in substrate 10. Polysilicon pads 15 are formed on source 11 and drain 12, and a bitline 17 is formed on polysilicon pad 15 while being covered by insulating layer 19 such as boro-phosphorus silicon glass. Then, spacers 31 are formed with insulating material such as $Si_3N_4$ or SiON on the side walls of the contact hole.

Here, polysilicon pad 15 increases the alignment margin of a contact and may not be formed if the cell size is large enough.

Also, spacer 31 is formed to prevent the enlargement of the contact hole which is caused by the wet-etching of the side walls of BPSG layer 19 using hydrofluoric acid (HF) solution as a cleaning solution used in the cleaning step after the formation of the contact hole, so that there is no lowering of the reliability in the semiconductor device.

However, when the conventional capacitor structure is applied to the COB structure as described above, the conductive layers are not connected with each other in the contact hole due to insulating spacer 31.

SUMMARY OF THE INVENTION

It is an object of the present invention to provide a method for manufacturing a capacitor of a semiconductor device which can be applied to a COB structure and which has a high cell capacitance even when formed through a simple etching process.

To achieve the above objects, a method may be provided for manufacturing a capacitor having a fin structure. Layers are sequentially stacked on a semiconductor substrate. The sequentially stacked layers include, in order, an insulating layer, an etching barrier layer, a first material layer and a second material layer. The semiconductor substrate includes a field oxide layer and a gate electrode formed thereon. A contact hole is formed which exposes the substrate by partially etching the second material layer, the first material layer, the etching barrier layer and the insulating layer. A first conductive layer is formed on the whole surface of the resultant structure having the contact hole. A storage electrode pattern is formed by patterning the first conductive layer and etching the second material layer. A second conductive layer is formed on the whole surface of the resultant structure so as to cover the storage electrode pattern and the first material layer. The second conductive layer is etched to expose the upper surface of the storage electrode pattern. A dielectric layer and a plate electrode layer are then sequentially formed on the resultant structure.

The method may further comprise a step of forming insulating spacers in the inner side wall of the contact hole, after forming the contact hole. Also, a third material layer may be formed on the first conductive layer with the same material as that of the first material layer after forming the first conductive layer. The third material layer may be made of oxide. The method may further comprise a step of etching the first material layer after etching the second conductive layer.

On the other hand, the first and second material layers may be made of an oxide such as HTO and a nitride such as SiN, respectively. It is preferred that a hydrofluoric acid such as HF and SBOE is used for the etchant when the second material layer is made of SOG.

To achieve the above objects, a method may be provided for manufacturing a capacitor having a fin structure. An insulating layer, an etching barrier layer, a first material layer, a second material layer, a first conductive layer and a third material layer are sequentially stacked on a semiconductor substrate having a field oxide layer and a gate electrode formed thereon. The third material layer, the first conductive layer, the second material layer, the first material layer, the etching barrier layer and the insulating layer are partially etched to form a contact hole exposing the substrate. A second conductive layer is formed on the whole surface of the resultant structure having the contact hole; and a storage electrode pattern is formed having a fin structure made of the second conductive layer and the first conductive layer connected therewith. A storage electrode pattern is formed by wet-etching the third material layer. A third conductive layer is formed on the whole surface of the resultant structure so as to cover the storage electrode pattern and the first material layer. The third conductive layer is etched to expose the upper surface of the storage electrode pattern. A dielectric layer and a plate electrode layer are then sequentially formed on the resultant structure.

The method may further comprise a step of etching the first material layer after etching the third conductive layer.

The first material layer may be made of oxide and the second and third material layers may be made of nitride. When the second and third material layers are made of SOG, hydrofluoric acid such as HF and SBOE is used as an etchant for those layers.

The fin structure storage electrode pattern may be formed by patterning the second conductive layer, the third material layer and the first conductive layer and wet-etching the second and third material layers.

To achieve the above objects, a method may be provided for manufacturing a capacitor having a fin structure. An insulating layer, an etching barrier layer, a first material layer, a second material layer and a third material layer are sequentially stacked on a semiconductor substrate having a field oxide layer and a gate electrode formed thereon. The third material layer, the second material layer, the first material layer, the etching barrier layer and the insulating layer are partially etched to form a contact hole exposing the substrate. A first conductive layer is formed on the whole surface of the resultant structure having the contact hole. A storage electrode pattern is formed having a fin structure made of the first conductive layer and the second material layer connected therewith. A second conductive layer is formed on the whole surface of the resultant structure so as to cover the storage electrode pattern and the etching barrier layer. The second conductive layer is etched to expose the upper surface of the storage electrode pattern. The fin structure storage electrode pattern is formed by patterning the first conductive layer, the third material layer and the second material layer and wet-etching the first and third material layers.

It is preferred that the first and third material layers are made of an oxide selected from a group consisting of HTO, LTO or BPSG. Also, it is preferred that the second material layer has low dry-etching selectivity with respect to the first and third material layers and high wet-etching selectivity with respect to the first and third material layers. The second material layer may be made of one of $Si_3N_4$ and SiON.

A buried bitline may be formed before forming the insulating layer. In this case, insulating spacers may be formed in the inner side wall of the contact hole after forming the contact hole.

As described above, the capacitor of the semiconductor device can be easily manufactured sine the etching process is simple using a stacked structure of oxide and nitride having less etching selectivity. Also, the effective area of the storage electrode increases. In addition, the capacitor of the semiconductor device can be applied to the COB structure where the insulating spacer should be formed in the contact hole.

BRIEF DESCRIPTION OF THE DRAWINGS

The above objects and advantages of the present invention will become more apparent by describing in detail preferred embodiments thereof with reference to the attached drawings in which.

Figure 7A:
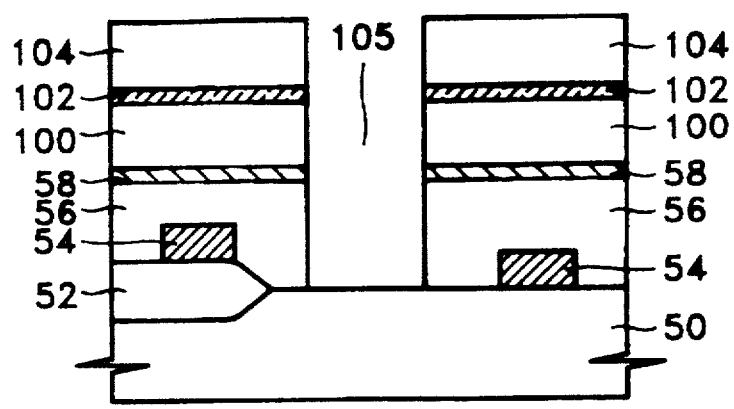
Figure 7B:
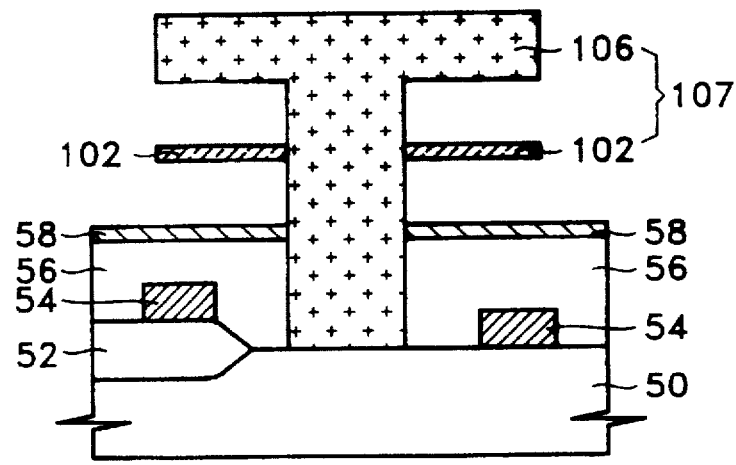
Figure 7C:
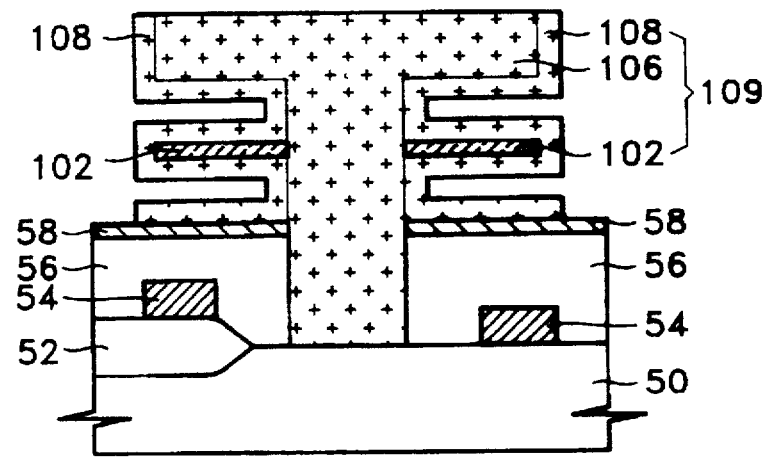

FIGS., 6A to 6C are cross-sectional diagrams illustrating a method for manufacturing a capacitor according to a fourth embodiment of the present invention;

FIGS. 7A to 7C are cross-sectional diagrams illustrating a method for manufacturing a capacitor according to a fifth embodiment of the present invention; and FIGS. 8A to 8D are cross-sectional diagrams illustrating a method for manufacturing a capacitor according to a sixth preferred embodiment of the present invention.

DETAILED DESCRIPTION OF THE INVENTION

Referring to FIGS. 3A to 3F, a method will now be described for manufacturing a capacitor according to a first preferred embodiment of the present invention.

Figure 1A:
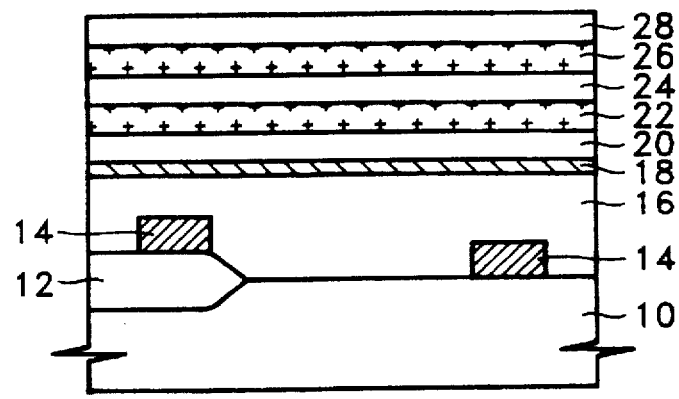
FIGS. 1A to 1C are cross-sectional diagrams illustrating a conventional method for manufacturing a fin structure capacitor.
Figure 1B:
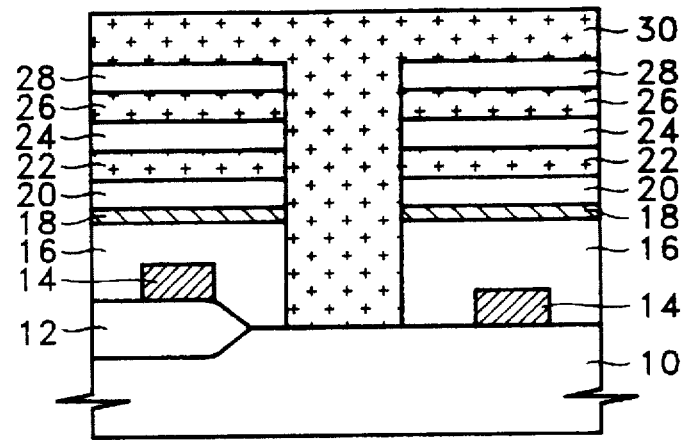
Figure 1C:
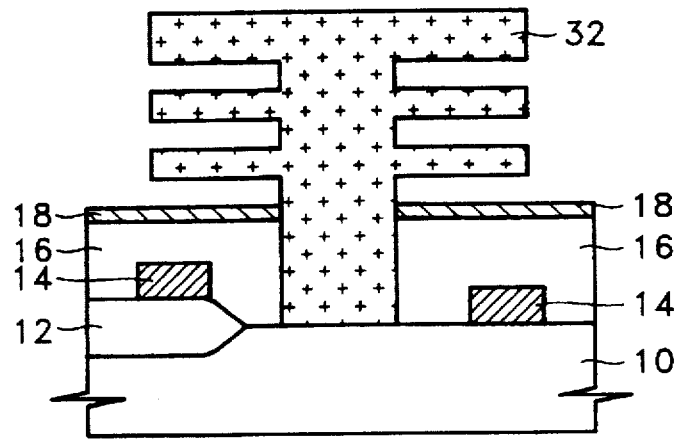
Figure 2:
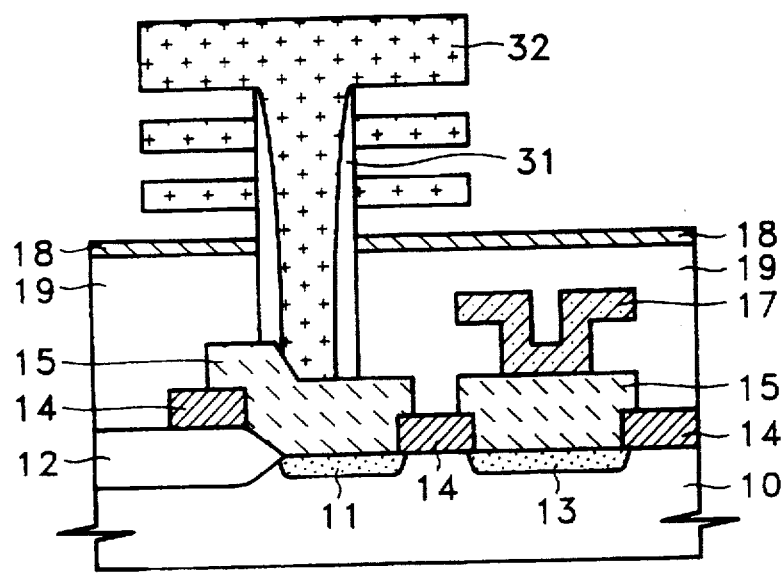
FIG. 2 is a cross-sectional diagram illustrating the conventional fin structure capacitor applied to a capacitor over bitline (COB)
Figure 3A:
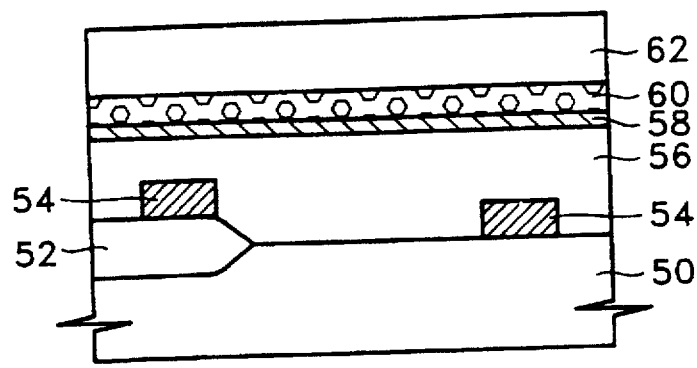
FIGS. 3A to 3F are cross-sectional diagrams illustrating a method for manufacturing a capacitor according to a first embodiment of the present invention.

FIG. 3A shows a step of forming first and second material layers 60 and 62. A field oxide layer 52 for device isolation and a gate electrode 54 are formed on a semiconductor substrate 50. Then, an insulating layer 56 is formed by depositing an insulating material such as borophosphorus silicon glass (BPSG). Insulating layer 56 is provided for insulating a lower structure such as a transistor formed on substrate 50. Subsequently, etching barrier layer 58 is formed on insulating layer 56 by depositing silicon nitride, and then first material layer 60 is formed by depositing a high-temperature oxide. Here, material consisting of etching barrier layer 58 has a lower etching ratio than material consisting of first material layer 60.

Thereafter, second material layer 62 is formed on first material layer 60 by depositing silicon nitride. Here, second material layer 62 may be made of an oxide such as silicon on glass (SOG).

Figure 3B:
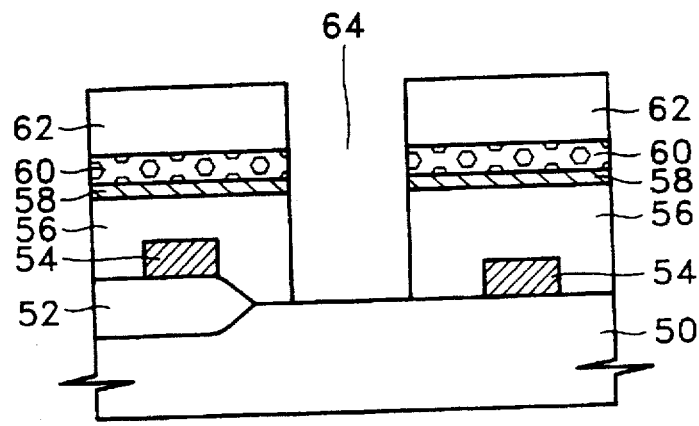

FIG. 3B shows a step of forming a contact hole 64. Second material layer 62, first material layer 60, etching barrier layer 58 and insulating layer 56 are partially etched through the use of a photolithography process, thereby forming a contact hold 64 exposing substrate 50. A storage electrode of a capacitor (to be formed later) and substrate 50 are connected with each other via contact hole 64.

Figure 3C:
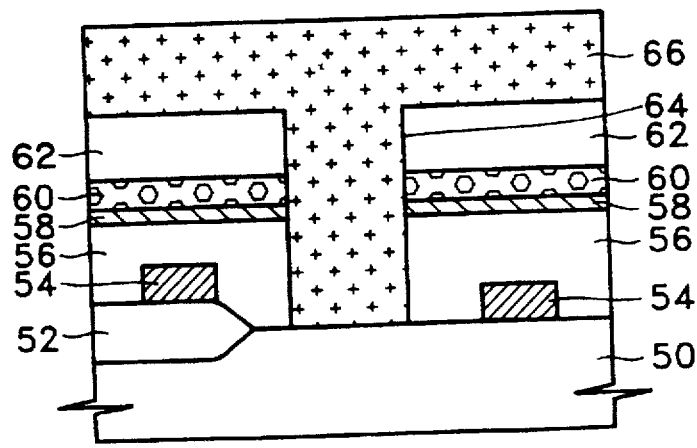

FIG. 3C shows a step of forming a first conductive layer 66. First conductive layer 66 is formed on the whole surface of the resultant structure having contact hole 64. That is, contact hole 64 is buried with polycrystal silicon. Polycrystal silicon of a predetermined thickness is deposited on second material layer 62, to form first conductive layer 66.

Figure 3D:
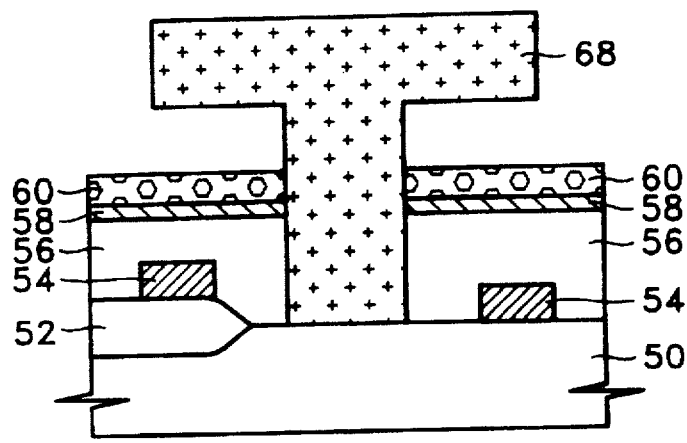

FIG. 3D shows a step of forming storage electrode pattern 68. First conductive layer 66 is patterned using mask pattern (not shown) for forming the storage electrode of the capacitor and second material layer 62 is wet-etched, to thereby form storage electrode pattern 68. Here, second material layer 62 is etched using a solution such as hydrophosphate ($H_3PO_4$), hydrofluoric acid (HF or surfactant buffered oxide etchant (SBOE)) which has high etching selectivity for second material layer 62 as compared to first conductive layer 66 and first material layer 60.

Figure 3E:
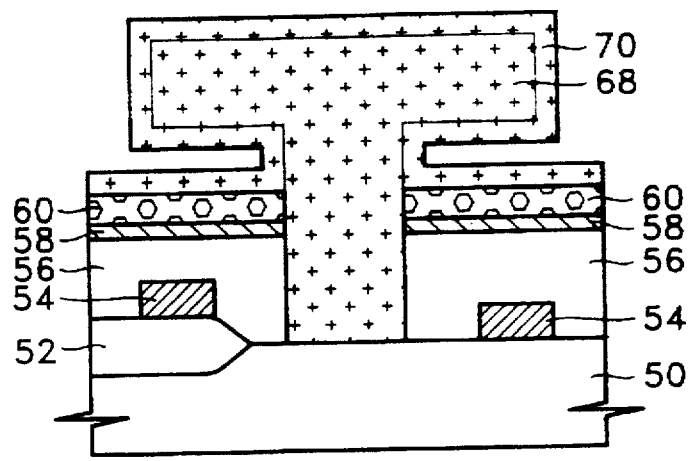

FIG. 3E shows a step of forming a second conductive layer 70. Second conductive layer 70 is formed on the whole surface of the resultant structure on which storage electrode pattern 68 is formed, by depositing the polycrystal silicon to cover storage electrode pattern 68. That is, second conductive layer 70 is formed over the upper, lower and side surfaces of storage electrode pattern 68 and on first material layer 60. Here, the effective area of storage electrode pattern 68 is enlarged due to second conductive layer 70, and the second fin of the storage electrode is formed.

Figure 3F:
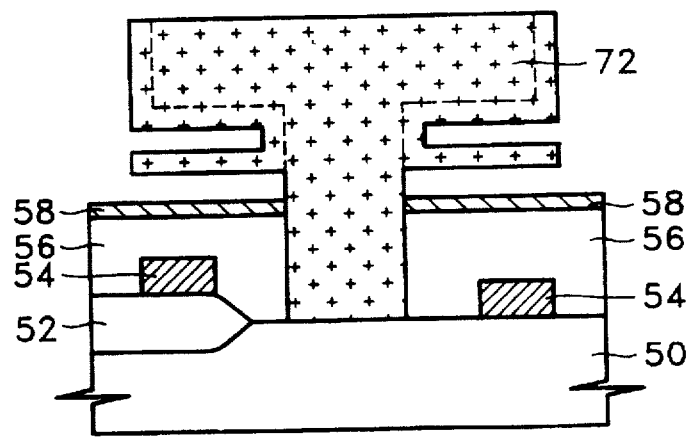

FIG. 3F shows a step of forming a storage electrode 72. Second conductive layer 70 is etched without a mask, to thereby expose the upper surface of storage electrode pattern 68. Then, first material layer 60 is wet-etched using SBOE, to thereby form storage electrode 72.

According to the above-described first preferred embodiment, a storage electrode having two fins can be formed using a simple etching process, in contrast to a conventional etching process in which the etching equipment is changed in order to form the contact hole and the storage electrode pattern. Also, the effective area of the storage electrode can be enlarged by forming second conductive layer 70.

The second preferred embodiment of the present invention will be described with reference to FIGS. 4A to 4C.

Figure 4A:
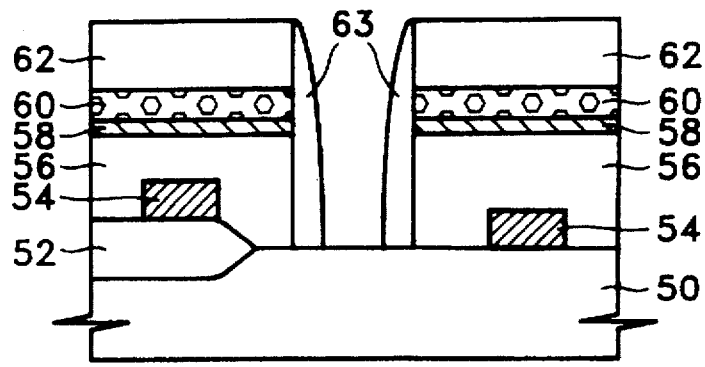
FIGS. 4A to 4C are cross-sectional diagrams illustrating a method for manufacturing a capacitor according to a second embodiment of the present invention.

FIG. 4A shows a step of forming spacers 63. All steps from the first step to the step of forming the contact hole are performed in the same manner as in the first preferred embodiment. Thereafter, an oxide layer is formed by depositing high-temperature oxide on the whole surface of the resultant structure, and then oxide spacers 63 are formed inside contact hole by performing anisotropic-etching on the oxide layer.

Figure 4B:
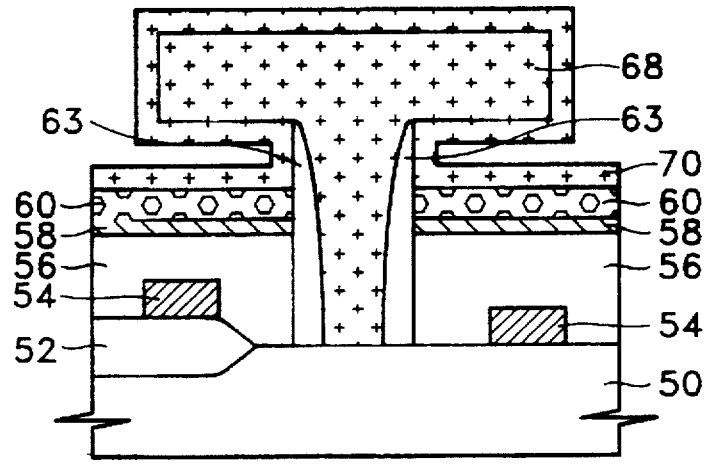

FIG. 4B shows a step of forming a storage electrode pattern 68 and a second conductive layer 70. After the first conductive layer is stacked on the whole surface of the resultant structure having spacers, the first conductive layer is dry-etched using a mask pattern (not shown) for forming the storage electrode of the capacitor in the same manner as described in the first preferred embodiment. Subsequently, second material layer 62 is wet-etched to form storage electrode pattern 68. Then, second conductive layer 70 is formed by depositing the polycrystal silicon on the whole surface of the resultant structure having storage electrode pattern 68 so as to cover storage electrode pattern 68.

Figure 4C:
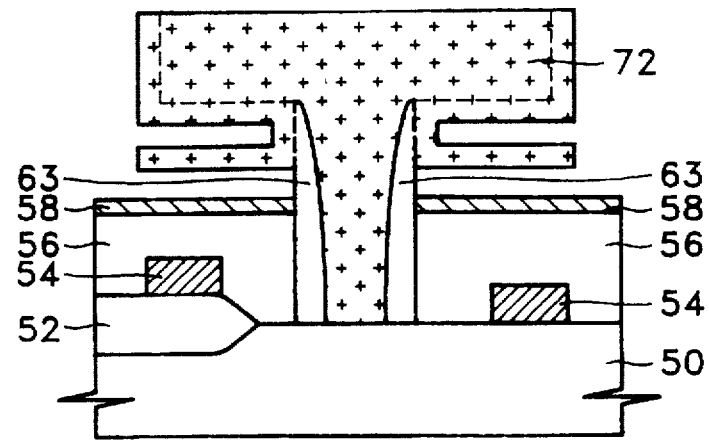

FIG. 4C shows a step of forming a storage electrode 72. The second conductive layer formed on storage electrode pattern 68 and the second conductive layer formed on the first material layer are etched without a mask, to thereby expose the upper surface of the storage electrode pattern. Then, storage electrode 72 is formed by wet-etching first material layer 60 using SBOE.

All steps in the second preferred embodiment are performed in the same manner as described in the first preferred embodiment, other than the step of forming the insulating spacers inside contact hole after forming the contact hole. The storage electrode can be insulated completely by forming the insulating spacers inside contact hole.

Also, the second preferred embodiment shows that first and second conductive layers are electrically connected even if the first preferred embodiment is applied to the capacitor over bitline (COB) structure.

The method for manufacturing the capacitor according to the third preferred embodiment will be described with reference to FIGS. 5A to 5C.

Figure 5A:
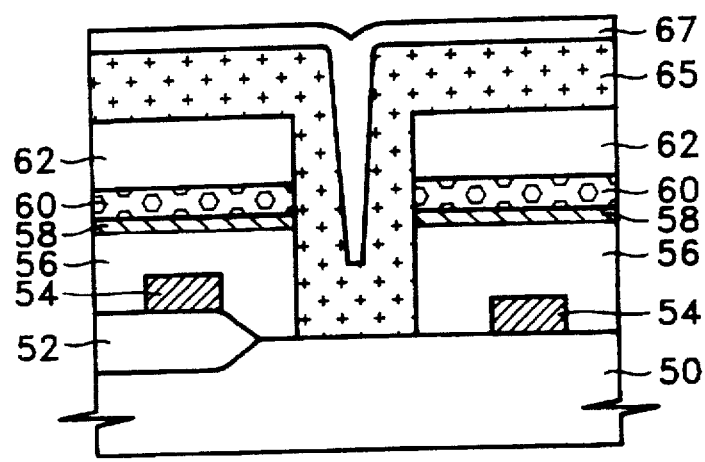
FIGS. 5A to 5C are cross-sectional diagrams illustrating a method for manufacturing a capacitor according to a third embodiment of the present invention.

FIG. 5A shows the step of forming a first conductive layer 65 and a third material layer 67. After the initial layers are formed and the contact hole is formed in the same manner as described in the first preferred embodiment, first conductive layer 65 is formed by depositing polysilicon on the whole surface of the substrate. Then, third material layer 67 is formed by depositing a high-temperature oxide on first conductive layer 65.

Figure 5B:
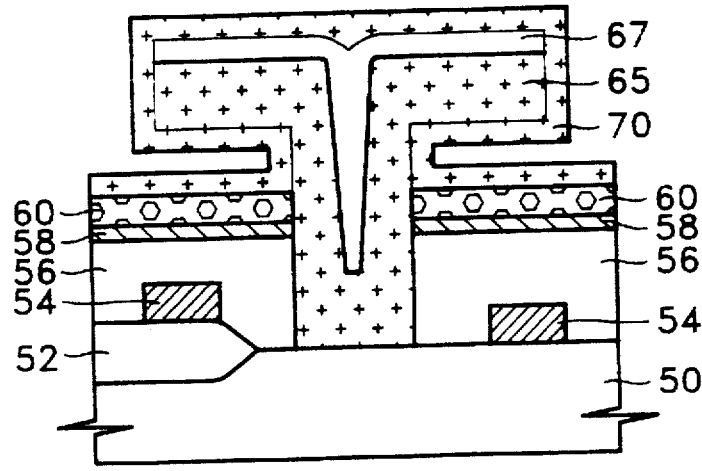

FIG. 5B shows a step of forming a second conductive layer 70. After dry-etching third material layer 67 and first conductive layer 65 using a mask pattern (not shown) for forming the storage electrode of the capacitor, a second material layer is wet-etched. Then, the polycrystal silicon is deposited on the whole surface of the resultant structure so as to cover first conductive layer 65 and third material layer 67, to thereby form second conductive layer 70.

Figure 5C:
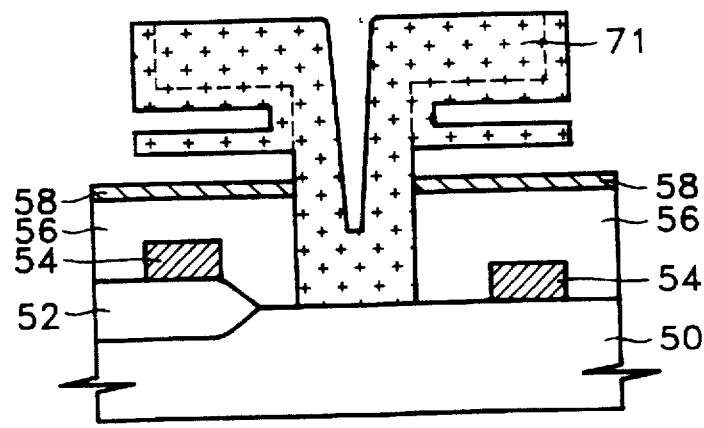

FIG. 5C shows a step of forming a storage electrode 71. A part of second conductive layer 70 formed on first conductive layer 65 and a part of second conductive layer 70 formed on first material layer 60 are etched without a mask, to thereby expose the upper surface of third material layer 67. Then, storage electrode 71 is formed by wet-etching first material layer 60. Since first and third material layers 60 and 67 are made of the same material, third material layer 67 is removed together with first material layer 60 through the wet-etching process.

All steps in the third preferred embodiment are performed in the same manner as in the first preferred embodiment, other than the step of forming third material layer 67 on the whole surface of the substrate having the contact hole after forming the contact hole. Second conductive layer 70 can be over-etched using third material layer 67 as a mask. Also, the effective area of the storage electrode can be enlarged by forming second conductive layer 70. First and second conductive layers are electrically connected even if the third preferred embodiment is applied to a COB structure.

The method for manufacturing the capacitor according to the fourth preferred embodiment will now be described with reference to FIGS. 6A to 6C.

Figure 6A:
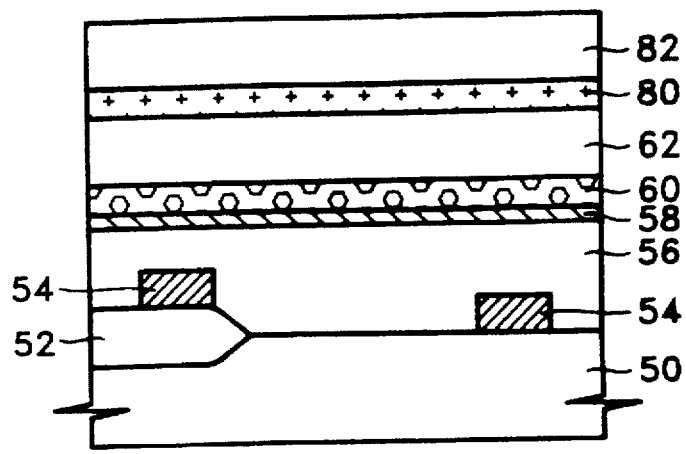

FIG. 6A shows a step of forming a first conductive layer 80 and a third material layer 82. The manufacturing steps are performed in the same manner as in the first preferred embodiment until a second material layer 62 is formed on semiconductor substrate 50. After a first conductive layer 80 is formed by depositing the polysilicon on second material layer 62, third material layer 82 is formed on first conductive layer 80. Here, the conductive layer and material layer can be additionally stacked if required.

Figure 6B:
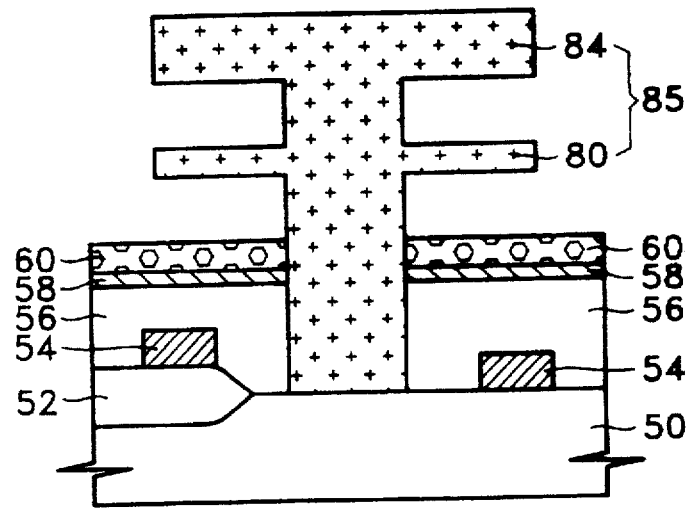

FIG. 6B shows a step of forming a storage electrode pattern 85. Third material layer 82, first conductive layer 80, second material layer 62, first material layer 60, an etching barrier layer 58 and an insulating layer 56 are partially etched through the photolithography process, to thereby form the contact hole exposing substrate 50. After forming a second conductive layer 84 by depositing the polysilicon on the whole surface of the resultant structure having the contact hole, second conductive layer 84, third material layer 82 and first conductive layer 80 are patterned using a mask pattern (not shown) for forming the storage electrode of the capacitor. Then, only material layers, second and third material layers are wet-etched using hydrofluoric acid (HF or SBOE), to thereby form storage electrode pattern 85. Here, storage electrode pattern 85 can be formed through another manner. That is, second conductive layer 84 is dry-etched using a mask pattern for forming the storage electrode of the capacitor and third material layer 82 is wet-etched. Then, first conductive layer 80 is dry-etched using the etched second conductive layer 84 as a mask pattern and second material layer 62 is wet-etched, to thereby form storage electrode pattern 85.

Figure 6C:
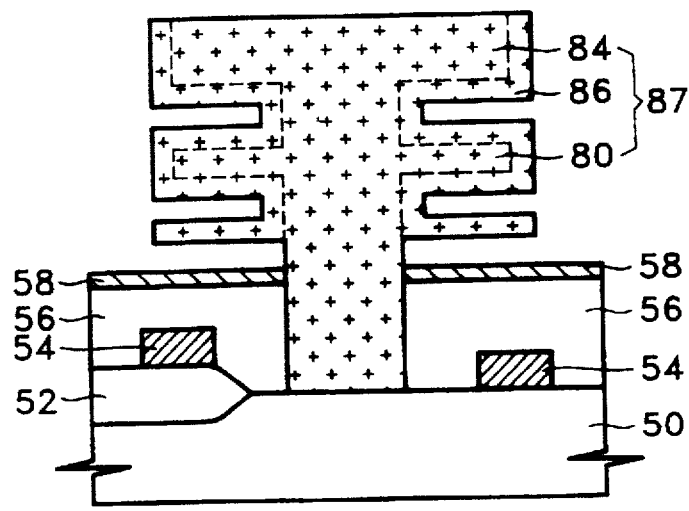

FIG. 6C shows a step of forming a storage electrode 87. The polycrystal silicon is deposited on the whole surface of the resultant structure so as to cover storage electrode pattern 85, to thereby form a third conductive layer 86. Then, third conductive layer 86 is etched without a mask for the upper surface of storage electrode pattern 85 to be exposed. Then, first material layer 60 is wet-etched to form storage electrode 87.

Here, after forming the contact hole, nitride spacers may be formed inside the contact hole. Also, after forming the second conductive layer, a fourth material layer may be formed on the first conductive layer.

According to the above-described method, a capacitor having three fins can be manufactured through a simple process as compared with conventional methods. Also, the effective area of the storage electrode can be enlarged by forming third conductive layer 86. Even if the fourth preferred embodiment is applied to a COB structure, first, second and third conductive layers can be connected electrically.

The method for manufacturing the capacitor according to the fifth preferred embodiment will be described with reference to FIGS. 7A to 7C.

FIG. 7A shows a step of forming a contact hole 105. These manufacturing steps are performed in the same manner as in the first preferred embodiment until an etching barrier layer 58 is formed on semiconductor substrate 50. First, second and third material layers 100, 102 and 104 are formed by sequentially stacking high-temperature oxide, silicon nitride ($Si_3N_4$) and high-temperature oxide on etching barrier layer 58. Then, third material layer 104, second material layer 102 and first material layer 100, etching barrier layer 58 and insulating layer 56 are partially etched using a photolithography process, to thereby form contact hole 105 exposing substrate 50. Here, in contrast to a conventional method, since the layers forming contact hole 105 are composed of only high-temperature oxide (HTO) and silicon nitride ($Si_3N_4$) layers having low etching selectivity, contact hole 105 can be formed through a one-step etching process.

Here, second material layer 102 is made of either one of SiN and SiON having low dry-etching selectivity and high wet-etching selectivity with respect to the first and third material layers 100 and 104.

FIG. 7B shows a step of forming a storage electrode pattern 107. A first conductive layer 106 is formed by depositing polysilicon on the whole surface of substrate 50 having contact hole 105. Then, first conductive layer 106 is dry-etched using a mask pattern (not shown) for forming the storage electrode of the capacitor. Subsequently, third material layer 104 is wet-etched using SBOE solution and second material layer 102 is dry-etched using the etched first conductive layer 106 as a mask pattern. Thereafter, first material layer 100 under second material layer 102 is wet-etched using SBOE solution, to thereby form storage electrode pattern 107.

On the other hand, when etching first conductive layer 106, third and second material layers 104 and 102 are sequentially dry-etched and then the remaining third and first material layers 104 and 100 are wet-etched, to thereby form storage electrode pattern 107.

FIG. 7C shows a step of forming a storage electrode 109. A second conductive layer 108 is formed by depositing the polycrystal silicon on the whole surface of the resultant structure so as to cover storage electrode pattern 107. Then, a part of second conductive layer 108 formed on first conductive layer 106 and a part of second conductive layer 108 formed on etching barrier layer 58 are etched without a mask until storage electrode pattern 107 is exposed, to thereby form storage electrode 109.

According to the fifth preferred embodiment of the present invention, the capacitor can be formed through a simple etching process. In addition, three fins can be formed by stacking only two conductive layers so that sufficient effective area can be secured without increasing the step difference in the cell.

The method for manufacturing the capacitor according to the sixth preferred embodiment of the present invention will now be described with reference to FIGS. 8A to 8D. This sixth preferred embodiment is an example illustration of an application of the capacitor manufacturing method of the fifth preferred embodiment to a COB structure.

Figure 8A:
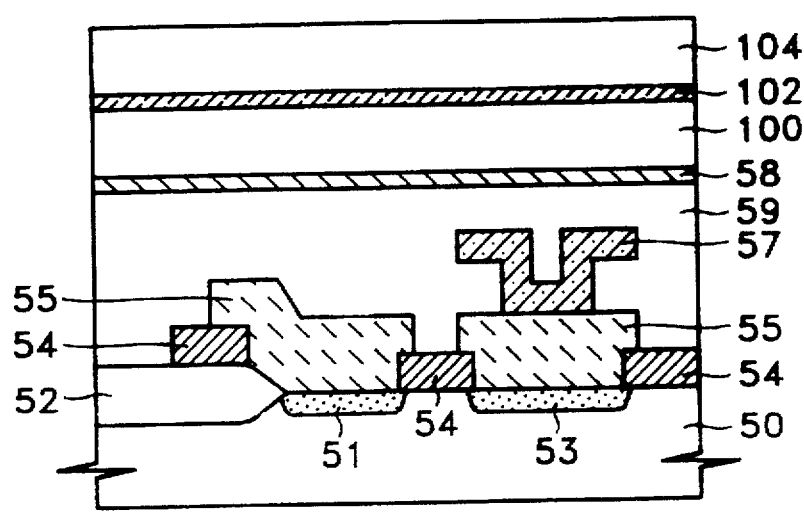

First, referring to FIG. 8A, the COB structure will be briefly explained. In the COB structure, a bitline is formed prior to the formation of the capacitor. Considering the general structure therefor, a field oxide layer 52 formed for device isolation and a gate electrode 54 are formed on a semiconductor substrate 50, and a source 51 and a drain 53 are formed on substrate 50. Polysilicon pads 55 are formed on source 51 and drain 53. Bitline 57 is formed on the polysilicon pad 55 formed on drain 53, while being covered with an insulating layer 59 of BPSG. Polysilicon page 55 is provided for improving the alignment margin of the contact and may be not formed if the cell size is great enough.

In the COB structure, since the lower portion of the storage electrode (to be formed later) is planarized by BPSG layer 59, the surface area of the storage electrode increases, and the following photolithography process can be performed easily and a sufficient design margin can be secured.

FIG. 8A shows a step of forming first, second and third material layers 100, 102 and 104. In the same manner as in the fifth preferred embodiment, first, second and third material layers 100, 102 and 104 are formed on etching barrier layer 58 formed on insulating layer 59 for insulating the transistor having the buried bitline.

Figure 8B:
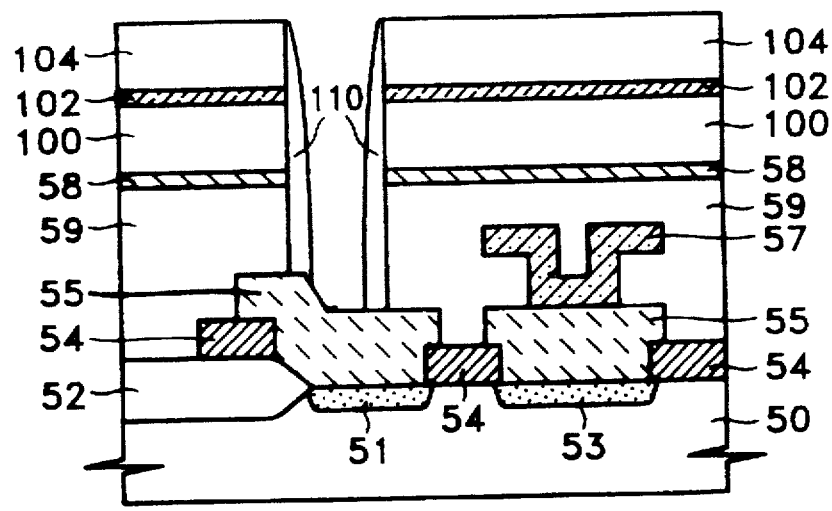

FIG. 8B shows a step of forming spacers 110. Third, second and first material layers 104, 102 and 100, etching barrier layer 58 and insulating layer 59 are partially etched through the photolithography process, to thereby form the contact hole by which silicon pad 55 formed on source 50 is exposed. Here, the contact hole may be formed through only once etching process as the fifth preferred embodiment. After depositing silicon nitride ($Si_3N_4$) on the whole surface of the resultant structure having the contact hole, the etching process is performed, to thereby form spacers 110 inside contact hole. Spacers 110 is provided for preventing the side of contact hole from being etched by the cleaning solution. Spacers 110 are made either one of $Si_3N_4$ and SiON having high wet-etching selectivity with respect to insulating layer 59 covering bitline 57.

All steps after the step of forming spacers 110 are performed in the same manner as described in the fifth preferred embodiment.

Figure 8C:
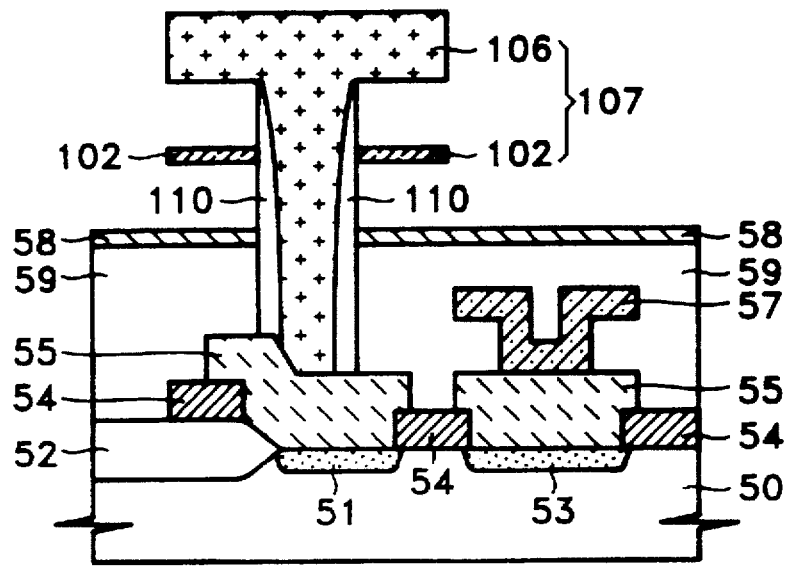

FIG. 8C shows a step of forming a storage electrode pattern 107. A first conductive layer 106 is formed on the whole surface of the resultant structure having spacers 110. Then, first conductive layer 106 is dry-etched using a mask pattern (not shown) for forming the storage electrode of the capacitor. Subsequently, third material layer 104 is wet-etched and then second material layer 102 is dry-etched using the etched first conductive layer 106 as a mask pattern. Thereafter, first material layer 100 under second material layer 102 is wet-etched, to thereby form storage electrode pattern 107.

Figure 8D:
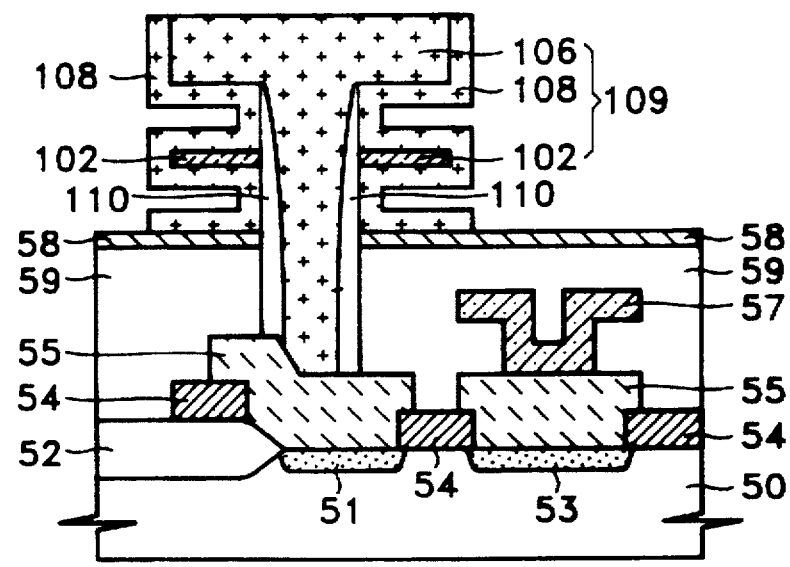

FIG. 8D shows a step of forming a storage electrode 109. A second conductive layer 108 is formed by depositing the polycrystal silicon on the whole surface of the resultant structure so as to cover storage electrode pattern 107. Then, second conductive layer 108 formed on first conductive layer 106 and second conductive layer 108 formed on etching barrier layer 58 are etched without a mask until storage electrode pattern 107 is exposed, to thereby form storage electrode 109.

When forming the COB structure having the insulating spacers inside the contact hole, the conductive layers for forming the storage electrode are easily connected for forming a plurality fins in the above present invention, in contrast to the conventional method in which the conductive layers for forming the storage electrode cannot be connected with each other.

As described above, the manufacturing process is not complicated even when forming a stacked capacitor structure having multi-layered polysilicon. Thus, manufacturing costs are reduced. Also, a sufficient effective area can be secured without increasing the step difference in the cell. The multi-layered fin structure can be applied to a COB structure having insulating spacers inside a contact hole.

The present invention is not limited to the particular forms illustrated and further modifications and improvements will occur to those skilled in the art.

What is claimed is:

1. A method for manufacturing a capacitor having a fin structure comprising the steps of:
   sequentially stacking an insulating layer, an etching barrier layer, a first material layer and a second material layer on a semiconductor substrate without forming a conductive layer between said first material layer and said second material layer, said first material layer and said second material layer each being insulative, a field oxide layer and a gate electrode having been formed on said semiconductor substrate before said step of sequentially stacking;
   forming a contact hole exposing said substrate by partially etching said second material layer, said first material layer, said etching barrier layer and said insulating layer;
   forming a first conductive layer on surfaces of the resultant structure having said contact hole;
   forming a storage electrode pattern by patterning said first conductive layer and by etching said second material layer;
   forming a second conductive layer on an exposed surface of said storage electrode pattern and an upper surface of said first material layer so as to cover said storage electrode pattern and said first material layer;
   etching said second conductive layer to expose an upper surface of said storage electrode pattern; and
   sequentially forming a dielectric layer and a plate electrode layer on the resultant structure including the exposed upper surface of said storage electrode pattern.

2. A method for manufacturing a capacitor as claimed in claim 1, further comprising the step of forming insulating spacers in the inner side wall of said contact hole after forming said contact hole.

3. A method for manufacturing a capacitor as claimed in claim 1, further comprising the step of etching said first material layer after etching said second conductive layer.

4. A method for manufacturing a capacitor as claimed in claim 1, wherein said first and second material layers comprise oxide and nitride, respectively.

5. A method for manufacturing a capacitor as claimed in claim 1, wherein said second material layer comprises SOG and hydrofluoric acid is used to etch said second material layer.

6. A method for manufacturing a capacitor as claimed in claim 1, wherein said step of forming said first conductive layer comprises completely filling said contact hole with material forming said first conductive layer.

7. A method for manufacturing a capacitor of a semiconductor device, said method comprising:
   forming a stack said stack comprising an insulating layer formed on a semiconductor substrate, said stack further comprising a field oxide layer and a gate electrode disposed between said semiconductor substrate and said insulating layer, said stack further comprising an etching barrier layer disposed over said insulating layer, a lower material layer disposed over said etching barrier layer, and an upper material layer disposed over said lower material layer, said stack being without a conductive layer between said lower material layer and said upper material layer, said lower material layer and said upper material layer each being insulative, said stack further comprising a contact hole exposing said substrate, said contact hole extending through said upper material layer, said lower material layer, said etching barrier layer, and said insulating layer;
   forming a filling conductive layer on at least all upper surfaces of said stack, said filling conductive layer substantially filling said contact hole;
   forming a storage electrode pattern by patterning said filling conductive layer and by etching said upper material layer;
   forming an outer conductive layer on an exposed surface of said storage electrode pattern so as to cover said storage electrode pattern; and
   at least partially etching said outer conductive layer to expose an upper surface of said storage electrode pattern.

8. The method of claim 7, further comprising forming oxide spacers on inner side-wall surfaces of said contact hole before said step of forming said filling conductive layer.

9. The method according to claim 7, further comprising forming a further upper material layer on said filling conductive layer before said step of forming said storage electrode pattern.

10. The method according to claim 7, said stack further comprising an initial conductive layer disposed over said upper material layer and a further upper material layer disposed over said initial conductive layer, said contact hole extending through said further upper material layer, said initial conductive layer, said upper material layer, said lower material layer, said etching barrier layer, and said insulating layer, wherein said storage electrode pattern is formed by patterning said filling conductive layer, said further upper material layer and said initial conductive layer and by etching said upper material layer and said lower material layer.

11. The method according to claim 7, said stack further comprising a middle material layer disposed between said lower material layer and said upper material layer, said contact hole extending through said upper material layer, said middle material layer, said lower material layer, said etching barrier layer, and said insulating layer, wherein said storage electrode pattern is formed by patterning said filling conductive layer, said upper material layer and said middle layer and by etching said upper material layer and said lower material layer.

12. The method according to claim 11, further comprising forming spacers on inner side-wall surfaces of said contact hole before said step of forming said filling conductive layer, said spacers having a high wet-etching selectivity with respect to said insulating layer.

* * * * *